US009021952B2

(12) United States Patent
Miller

(10) Patent No.: US 9,021,952 B2
(45) Date of Patent: May 5, 2015

(54) LASER-ASSISTED ALIGNMENT OF MULTI-STATION FLEXOGRAPHIC PRINTING SYSTEM

(71) Applicant: Steven A. Miller, The Woodlands, TX (US)

(72) Inventor: Steven A. Miller, The Woodlands, TX (US)

(73) Assignee: Uni-Pixel Displays, Inc., The Woodlands, TX (US)

( * ) Notice: Subject to any disclaimer, the term of this patent is extended or adjusted under 35 U.S.C. 154(b) by 43 days.

(21) Appl. No.: 13/851,929

(22) Filed: Mar. 27, 2013

(65) Prior Publication Data

US 2014/0290517 A1    Oct. 2, 2014

(51) Int. Cl.
| | | |
|---|---|---|
| B41F 5/24 | (2006.01) | |
| B41F 13/12 | (2006.01) | |
| B41F 27/00 | (2006.01) | |
| B41F 33/00 | (2006.01) | |

(52) U.S. Cl.
CPC ........... B41F 27/005 (2013.01); B41F 33/0036 (2013.01)

(58) Field of Classification Search
CPC ............... B41F 5/04; B41F 5/06; B41F 5/24; B41F 17/14; B41F 13/12; B41F 13/14; B41F 13/16; B41F 33/00; B41F 33/0036; B41F 27/005
USPC .......................... 101/481, 485, 486, DIG. 36
See application file for complete search history.

(56) References Cited

U.S. PATENT DOCUMENTS

| | | |
|---|---|---|
| 4,704,033 A | 11/1987 | Fay et al. |
| 5,822,119 A | 10/1998 | Rasmussen et al. |
| 5,900,637 A | 5/1999 | Smith |
| 6,082,412 A | 7/2000 | Wildeman et al. |

(Continued)

FOREIGN PATENT DOCUMENTS

| | | |
|---|---|---|
| WO | 2005105449 A1 | 11/2005 |
| WO | 2013063034 A1 | 5/2013 |

OTHER PUBLICATIONS

International Search Report of the International Searching Authority (Korea) for international application PCT/US2014/061413 dated Jan. 15, 2015.

(Continued)

*Primary Examiner* — Leslie J Evanisko
(74) *Attorney, Agent, or Firm* — Basil M. Angelo

(57) ABSTRACT

A multi-station flexographic printing system includes a plurality of flexographic printing stations. Each flexographic printing station includes a flexo master. Each flexo master comprises a Fresnel zone pattern in a unique position. A method of aligning a plurality of flexographic printing stations includes printing a Fresnel zone pattern on a substrate in a unique position for each flexographic printing station. Light is directed through the Fresnel zone patterns on the substrate. The light focused by the Fresnel zone patterns is captured with a sensor device.

6 Claims, 10 Drawing Sheets

(56) References Cited

U.S. PATENT DOCUMENTS

| | | |
|---|---|---|
| 6,285,033 B1 | 9/2001 | Matsumoto |
| 6,343,550 B1 | 2/2002 | Feesler |
| 7,138,919 B2 | 11/2006 | Clare et al. |
| 8,146,497 B2 | 4/2012 | Caliari |
| 8,384,691 B2 | 2/2013 | Frey et al. |
| 2002/0170451 A1 | 11/2002 | Nakazawa et al. |
| 2004/0017431 A1 | 1/2004 | Mizuyama et al. |
| 2007/0068404 A1 | 3/2007 | Hirahara et al. |
| 2010/0122638 A1 | 5/2010 | Schneider et al. |
| 2011/0045248 A1 | 2/2011 | Hoffmuller et al. |
| 2013/0220157 A1* | 8/2013 | Heng .......................... 101/481 |

OTHER PUBLICATIONS

Written Opinion of the International Searching Authority (Korea) for international application PCT/US2014/061413 dated Jan. 15, 2015.

International Search Report of the International Searching Authority (Korea) for corresponding international application PCT/US2013/065898 dated Feb. 3, 2014.

Written Opinion of the International Searching Authority (Korea) for corresponding international application PCT/US2013/065898 dated Feb. 3, 2014.

\* cited by examiner

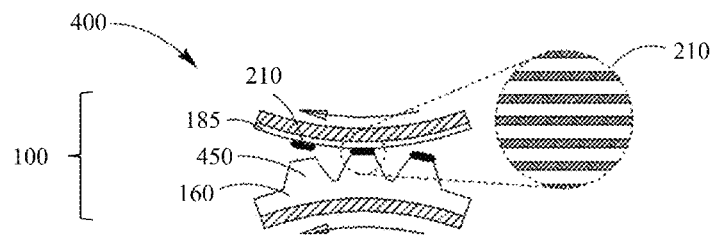
FIG. 4A
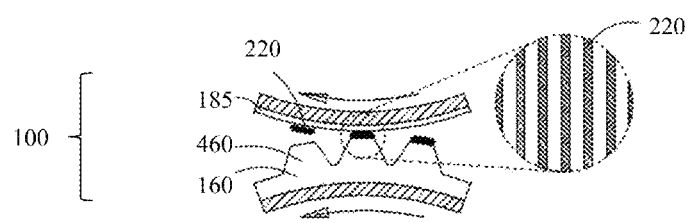
FIG. 4B
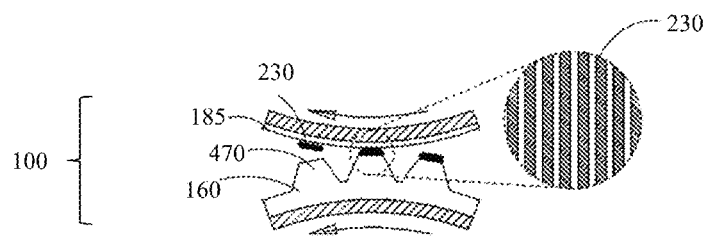
FIG. 4C
FIG. 4

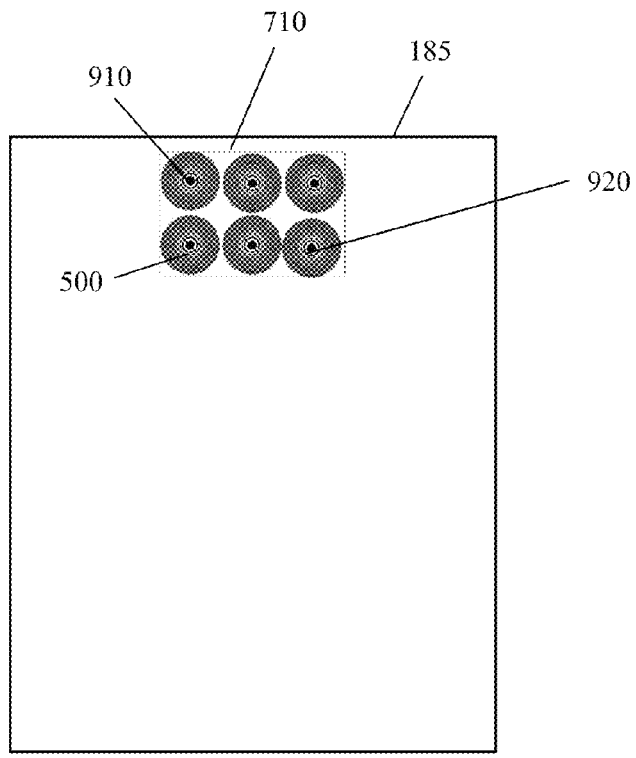
FIG. 9A
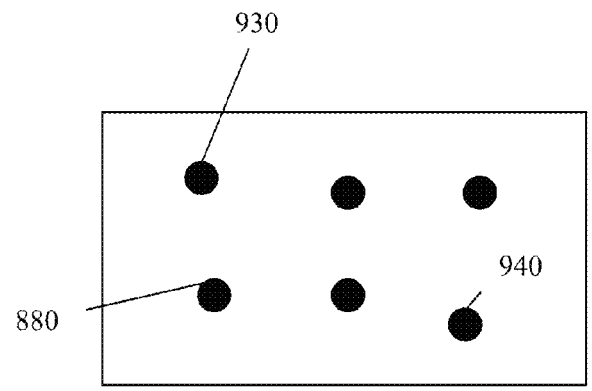
FIG. 9B
FIG. 9

LASER-ASSISTED ALIGNMENT OF MULTI-STATION FLEXOGRAPHIC PRINTING SYSTEM

BACKGROUND OF THE INVENTION

An electronic device with a touch screen allows a user to control the device by touch. The user may interact directly with the objects depicted on the display through touch or gestures. Touch screens are commonly found in consumer, commercial, and industrial devices including smartphones, tablets, laptop computers, desktop computers, monitors, gaming consoles, and televisions. A touch screen includes a touch sensor that includes a pattern of conductive lines disposed on a substrate.

Flexographic printing is a rotary relief printing process that transfers an image to a substrate. A flexographic printing process may be adapted for use in the fabrication of touch sensors. In addition, a flexographic printing process may be adapted for use in the fabrication of flexible and printed electronics ("FPE").

BRIEF SUMMARY OF THE INVENTION

According to one aspect of one or more embodiments of the present invention, a multi-station flexographic printing system includes a plurality of flexographic printing stations. Each flexographic printing station includes a flexo master. Each flexo master comprises a Fresnel zone pattern in a unique position.

According to one aspect of one or more embodiments of the present invention, a method of aligning a plurality of flexographic printing stations includes printing a Fresnel zone pattern on a substrate in a unique position for each flexographic printing station. Light is directed through the Fresnel zone patterns on the substrate. The light focused by the Fresnel zone patterns is captured with a sensor device.

Other aspects of the present invention will be apparent from the following description and claims.

BRIEF DESCRIPTION OF THE DRAWINGS

FIG. 4 shows a portion of a multi-station flexographic printing system in accordance with one or more embodiments of the present invention.

FIG. 9 shows an example of a substrate printed with a Fresnel zone matrix that includes one or more misaligned Fresnel zone patterns in accordance with one or more embodiments of the present invention.

DETAILED DESCRIPTION OF THE INVENTION

Figure 1:
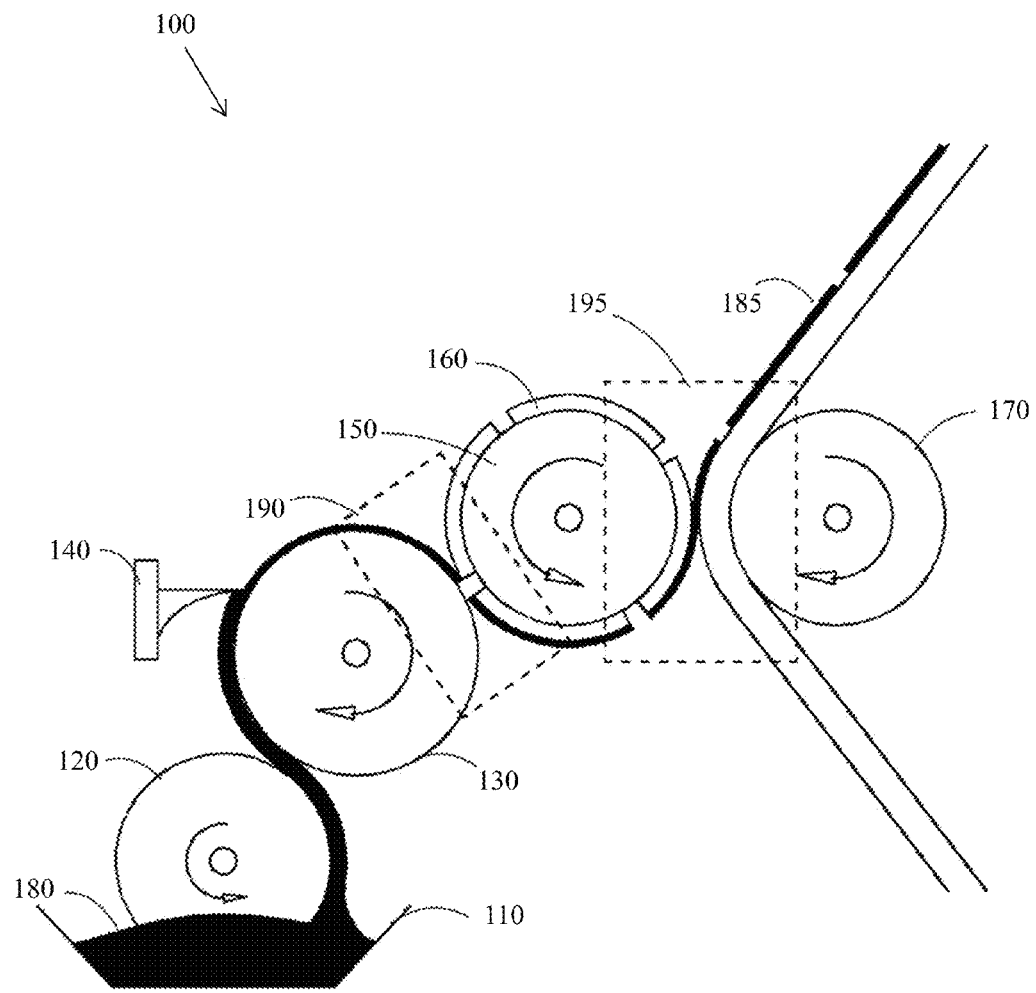
FIG. 1 shows a flexographic printing station in accordance with one or more embodiments of the present invention.

One or more embodiments of the present invention are described in detail with reference to the accompanying figures. For consistency, like elements in the various figures are denoted by like reference numerals. In the following detailed description of the present invention, specific details are set forth in order to provide a thorough understanding of the present invention. In other instances, well-known features to one of ordinary skill in the art are not described to avoid obscuring the description of the present invention.

A conventional flexographic printing system includes a flexo master with embossing patterns that transfer an image to a substrate. In some instances, the embossing patterns include one or more patterned lines or features having different widths or orientations. When the patterned lines or features have different widths, the patterned lines or features of the embossing patterns also have different heights. These height differentials may be a consequence of fabricating the flexo master with patterned lines or features with different widths. The height differentials give rise to a number of issues including non-uniform line widths and discontinuities of the printed patterned lines or printed features on the substrate. In addition, because a conventional flexographic printing system uses a flexo master that includes patterned lines or features with different widths or orientations, all patterned lines and features are subject to the same process parameters including speed, composition, viscosity, pressure, or volume of ink.

In one or more embodiments of the present invention, a multi-station flexographic printing system allows for roll-to-roll printing of micrometer-fine lines and features on a transparent substrate with improved alignment accuracy.

FIG. 1 shows a flexographic printing station 100 in accordance with one or more embodiments of the present invention. Flexographic printing station 100 may include an ink pan 110, an ink roll 120 (also referred to as a fountain roll), an anilox roll 130 (also referred to as a meter roll), a doctor blade 140, a printing plate cylinder 150, a flexo master 160 (also referred to as a flexographic printing plate), and an impression cylinder 170.

In operation, ink roll 120 transfers ink 180 from ink pan 110 to anilox roll 130. In one or more embodiments of the present invention, ink 180 may be a catalytic ink or catalytic alloy ink that serves as a base layer suitable for electroless plating. One of ordinary skill in the art will recognize that the composition of ink 180 may vary in accordance with one or more embodiments of the present invention. Anilox roll 130 is typically constructed of a steel or aluminum core that may be coated by an industrial ceramic whose surface contains a plurality of very fine dimples, known as cells (not shown). Doctor blade 140 removes excess ink 180 from anilox roll 130. In transfer area 190, anilox roll 130 meters the amount of ink 180 transferred to printing plate cylinder 150 to a uniform thickness. Printing plate cylinder 150 may be generally made of metal and the surface may be plated with chromium, or the like, to provide increased abrasion resistance. Flexo master 160 may be mounted on printing plate cylinder 150. In one or more embodiments of the present invention, flexo master 160 may be composed of rubber or a photo-polymer.

One or more substrates 185 move between the printing plate cylinder 150 and impression cylinder 170. In one or more embodiments of the present invention, substrate 185 may be transparent. Transparent means the transmission of light with a transmittance rate of 90% or more. In one or more embodiments of the present invention, substrate 185 may be polyethylene terephthalate ("PET"), polyethylene naphthalate ("PEN"), cellulose acetate ("TAC"), linear low-density polyethylene ("LLDPE"), bi-axially-oriented polypropylene ("BOPP"), polyester, polypropylene, or glass. One of ordinary skill in the art will recognize that the composition of substrate 185 may vary in accordance with one or more embodiments of the present invention.

Impression cylinder 170 applies pressure to printing plate cylinder 150, transferring an image from embossing patterns of flexo master 160 onto substrate 185 at transfer area 195. The rotational speed of printing plate cylinder 150 is synchronized to match the speed at which substrate 185 moves through flexographic printing station 100. The speed may vary between 20 feet per minute to 750 feet per minute.

Figure 2:
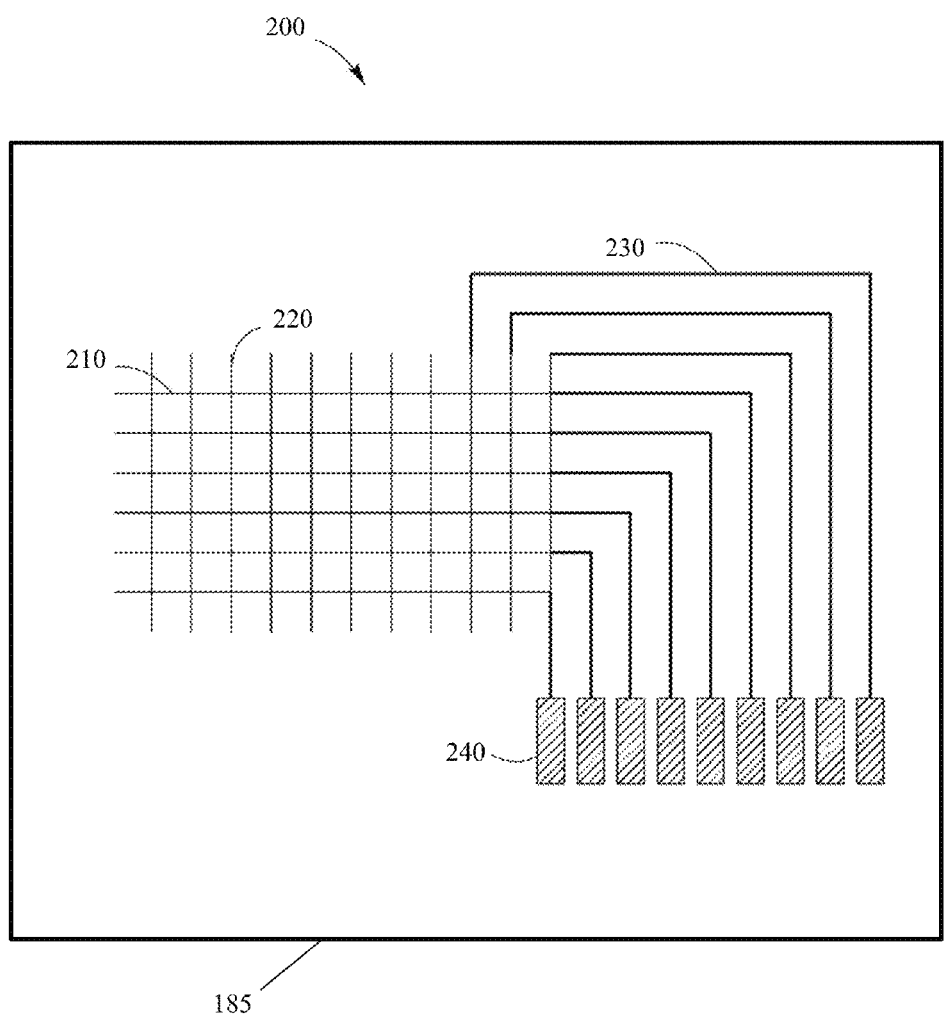
FIG. 2 shows a portion of a printed pattern design on substrate having junctions between lines or features of different widths or orientations in accordance with one or more embodiments of the present invention.

FIG. 2 shows a portion of a printed pattern design 200 on substrate having junctions between lines or features of different widths or orientations in accordance with one or more embodiments of the present invention. In one or more embodiments of the present invention, printed pattern design 200 may be used to form a touch sensor (not independently illustrated). In one or more embodiments of the present invention, printed pattern design 200 may include x-axis printed lines 210 and y-axis printed lines 220 connected by interconnects 230 to connectors 240 on substrate 185. Interconnects 230 may be used to route x-axis printed lines 210 and y-axis printed lines 220 to connectors 240. Connectors 240 may be configured to provide a connection to an interface (not shown) to a touch sensor controller (not shown). In one or more embodiments of the present invention, one or more of x-axis printed lines 210, y-axis printed lines 220, interconnects 230, and connectors 240 may have different line widths. In one or more embodiments of the present invention, one or more of x-axis printed lines 210, y-axis printed lines 220, interconnects 230, and connectors 240 may have different orientations. One of ordinary skill in the art will recognize that the configuration, location, and size of printed pattern design 200 may vary in accordance with one or more embodiments of the present invention.

In one or more embodiments of the present invention, x-axis printed lines 210 and y-axis printed lines 220 may have line widths less than approximately 10 micrometers. In one or more embodiments of the present invention, x-axis printed lines 210 and y-axis printed lines 220 may have line widths in a range between approximately 10 micrometers and approximately 50 micrometers. In one or more embodiments of the present invention, x-axis printed lines 210 and y-axis printed lines 220 may have line widths greater than approximately 50 micrometers. One of ordinary skill in the art will recognize that the shape and width of x-axis printed lines 210 and y-axis printed lines 220 may vary in accordance with one or more embodiments of the present invention.

In one or more embodiments of the present invention, interconnects 230 may have line widths in a range between approximately 50 micrometers and approximately 100 micrometers. One of ordinary skill in the art will recognize that the shape and width of interconnects 230 may vary in accordance with one or more embodiments of the present invention. In one or more embodiments of the present invention, connectors 240 may have line widths greater than approximately 100 micrometers. One of ordinary skill in the art will recognize that the shape and width of connectors 240 may vary in accordance with one or more embodiments of the present invention.

Figure 3:
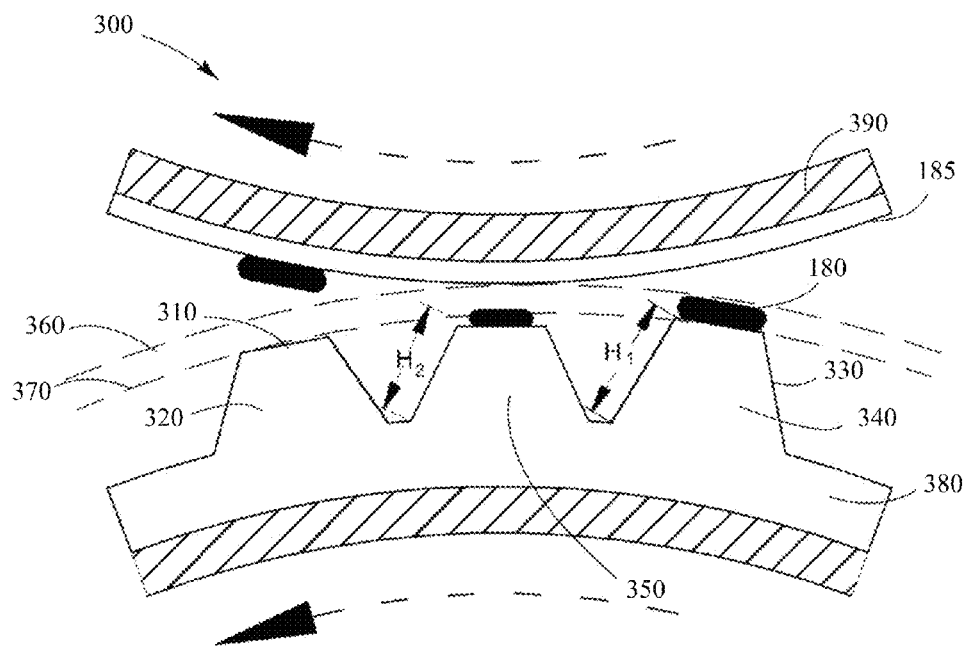
FIG. 3 shows a side view of a conventional flexo master with lines or features of different widths and heights.

FIG. 3 shows a side view 300 of a conventional flexo master 380 with lines or features of different widths or heights. Flexo master 380 includes raised printing surfaces 310 of patterned lines 320 that exhibit angled sidewalls 330. Ink 180 may be transferred from raised printing surfaces 310 to substrate 185 when impression cylinder 390 presses substrate 185 against raised printing surfaces 310 while flexo master 380 and impression cylinder 390 rotate.

Because patterned lines 320 exhibit different widths, they may exhibit different heights. The height differential of patterned lines 320 may be an inherent feature of flexo master 380 when patterned lines 320 have different widths. For example, patterned lines 340 may exhibit a height $H_1$, whereas patterned lines 350 may exhibit a different height $H_2$. Tall patterned lines 340 may pick up more ink 180 from anilox roll (not shown) and rotate along tall feature arc 360, which may exert more compression when transferring ink 180 to substrate 185. Conversely, short patterned lines 350 may pick up less ink 180 from the anilox roll (not shown) and rotate along small feature arc 370, which may exert less compression when transferring ink 180 to substrate 185. As a result, the height of patterned lines 320 impacts the amount of ink 180 transferred to substrate 185. Other factors may contribute to the height differential of patterned lines 320 including a mass differential under a given point of patterned lines 320. When patterned lines 320 swell from absorption of moisture, tall patterned lines 340 may swell more than short patterned lines 350 because of their higher density. As a result, printed patterned lines (not shown) on substrate 185 may exhibit significant line width variations that negatively affect printing performance. In addition, when a single flexo master 380 is used to print patterned lines with different widths or orientations, the same speed, composition, viscosity, pressure, and volume of ink must be used.

FIG. 4 shows a portion of a multi-station flexographic printing system 400 in accordance with one or more embodiments of the present invention. In one or more embodiments of the present invention, multi-station flexographic printing system 400 includes a plurality of flexographic printing stations 100 that each include an independent flexo master 160. In one or more embodiments of the present invention, multi-station flexographic printing system 400 may include a flexographic printing station 100, and an associated flexo master 160, for each desired line width, feature, orientation, or printing side. One of ordinary skill in the art will recognize that the number of flexographic printing stations 100 of multi-station flexographic printing system 400 may vary in accordance with one or more embodiments of the present invention.

FIG. 4A shows a portion of a first flexographic printing station 100 of multi-station flexographic printing system 400. A first flexo master 160 comprises an embossing pattern. The embossing pattern may comprise patterned lines 450 configured for printing lines 210 in an x-axis direction on substrate 185. In one or more embodiments of the present invention, because each of patterned lines 450 of flexo master 160 are the same width, patterned lines 450 may have the same height.

FIG. 4B shows a portion of a second flexographic printing station 100 of a multi-station flexographic printing system 400. A second flexo master 160 comprises an embossing pattern. The embossing pattern may comprise patterned lines 460 configured for printing lines 220 in a y-axis direction on substrate 185. In one or more embodiments of the present invention, because each of patterned lines 460 of flexo master 160 are the same width, patterned lines 460 may have the same height.

FIG. 4C shows a portion of a third flexographic printing station 100 of a multi-station flexographic printing system 400. A third flexo master 160 comprises an embossing pattern. The embossing pattern may comprise patterned lines 470 configured for printing interconnect and/or connector patterns 230 on substrate 185. In one or more embodiments of the present invention, because each of patterned lines 470 of flexo master 160 are the same width, patterned lines 470 may have the same height.

In one or more embodiments of the present invention, the width of patterned lines 450, patterned lines 460, and patterned lines 470 may be different. In one or more embodiments of the present invention, the orientation of patterned lines 450, patterned lines 460, and patterned lines 470 may be different. In one or more embodiments of the present invention, the height of patterned lines 450, patterned lines 460, and patterned lines 470 may be the same. Because the height differential between patterned lines 450, patterned lines 460, and patterned lines 470 may be minimized, ink 180 may be more uniformly transferred from the anilox roll (not shown) to patterned lines 450, patterned lines 460, and patterned lines 470 resulting in uniform printing of the printed patterns on substrate 185.

In one or more embodiments of the present invention, flexographic printing stations 100 of multi-station flexographic printing system 400 may be sequenced in an order suitable for a particular application. In one or more embodiments of the present invention, flexographic printing stations 100 of multi-station flexographic printing system 400 may be sequenced for printing on both sides of a substrate in an order suitable for a particular application. In one or more embodiments of the present invention, flexographic printing stations 100 of multi-station flexographic printing system 400 may be sequenced to print lines or features of different widths or orientations in an order suitable for a particular application. In one or more embodiments of the present invention, flexographic printing stations 100 of multi-station flexographic printing system 400 may be sequenced to print small lines or features before larger lines or features. One of ordinary skill in the art will recognize that the sequence of flexographic printing stations 100 of multi-station flexographic printing system 400 may vary in accordance with one or more embodiments of the present invention.

In one or more embodiments of the present invention, the use of different flexo masters 160 for each type of printed pattern allows for more efficient control of printing factors according to specific requirements of each printed pattern. For example, printed lines 210 in an x-axis direction may require a higher concentration of a plating catalyst in the ink 180 composition compared to wider printed connector patterns 240. As a result, the flexographic printing station 100 depicted in FIG. 4A may use a higher concentration of plating catalyst compared to other flexographic printing stations 100.

In one or more embodiments of the present invention, multi-station flexographic printing system 400 may include one or more UV curing modules (not shown). The UV curing module may include a UV light source that initiates the polymerization of acrylic groups within the ink 180 composition in the printed patterns. A UV curing module may include a UV light source that activates the plating catalyst within the ink 180 composition in the printed patterns. In certain embodiments, the ink 180 composition may include metal nanoparticles that may not require a plating catalyst or UV activation.

In one or more embodiments of the present invention, multi-station flexographic printing system 400 may include one or more electroless plating baths (not shown). An electroless plating bath may deposit a layer of conductive material on one or more of printed lines 210, printed lines 220, printed interconnects 230, and printed connectors 240 on substrate 185. In certain embodiments, a different type of conductive material may be used for one or more of printed lines 210 in an x-axis direction, printed lines 220 in a y-axis direction, interconnect patterns 230, and connectors 240.

In one or more embodiments of the present invention, a different ink 180 composition may be used for one or more flexo masters 160 of one or more flexographic printing stations 100 of multi-station flexographic printing system 400. In one or more embodiments of the present invention, the ink 180 composition for one or more flexo masters 160 may be varied to achieve a desired fabrication of substrate 185. In one or more embodiments of the present invention, one or more process parameters including target speed, composition, viscosity, pressure, and volume of ink 180 may be varied for one or more flexographic printing station 100.

In certain embodiments, a multi-station flexographic printing system 400 may include six flexographic printing stations 100. Three flexographic printing stations 100 may be used for printing x-axis, y-axis, and interconnect and/or connector lines and patterns on a first side of a substrate 185 and three flexographic printing stations 100 may be used for printing x-axis, y-axis, and interconnect and/or connector lines and patterns on a second side of the substrate 185.

In one or more embodiments of the present invention, a sequence of flexographic printing stations 100 may vary depending on the application. In certain embodiments, for example, x-axis lines may be printed on a first side of a substrate 185 by a first flexographic printing station 100 and then x-axis lines may be printed on a second side of the substrate 185 by a second flexographic printing station 100. As the process continues, y-axis lines may be printed on the first side of the substrate 185 by a third flexographic printing station 100 and then y-axis lines may be printed on the second side of the substrate 185 by a fourth flexographic printing station 100. Finally, interconnects and/or connectors may be printed on the first side of the substrate 185 by a fifth flexographic printing station 100 and then interconnects and/or connectors may be printed on the second side of the substrate 185 by a sixth flexographic printing station 100. One of ordinary skill in the art will recognize that the sequence of flexographic printing stations 100 of multi-station flexographic printing system 400 may vary in accordance with one or more embodiments of the present invention.

In certain embodiments, the substrate with x-axis, y-axis, and interconnect and/or connector patterns disposed on both sides of the substrate may form a capacitive touch sensor (not shown). To ensure proper operation of the touch sensor, the x-axis, y-axis, and interconnect and/or connector patterns on the substrate 185 must be properly aligned in machine and transverse direction with respect to one another. Because the system 400 may include a plurality of flexographic printing stations 100, the flexographic printing stations 100 must be aligned to ensure the x-axis, y-axis, and interconnect and/or connector patterns are properly aligned on the substrate 185. Alignment is more difficult when the printed lines or features have micrometer-fine line widths.

In one or more embodiments of the present invention, one or more flexographic printing stations 100 may include one or more flexo masters 160 that include a Fresnel zone pattern (not shown) suitable for producing a Fresnel lens (not shown) on substrate 185.

Figure 5:
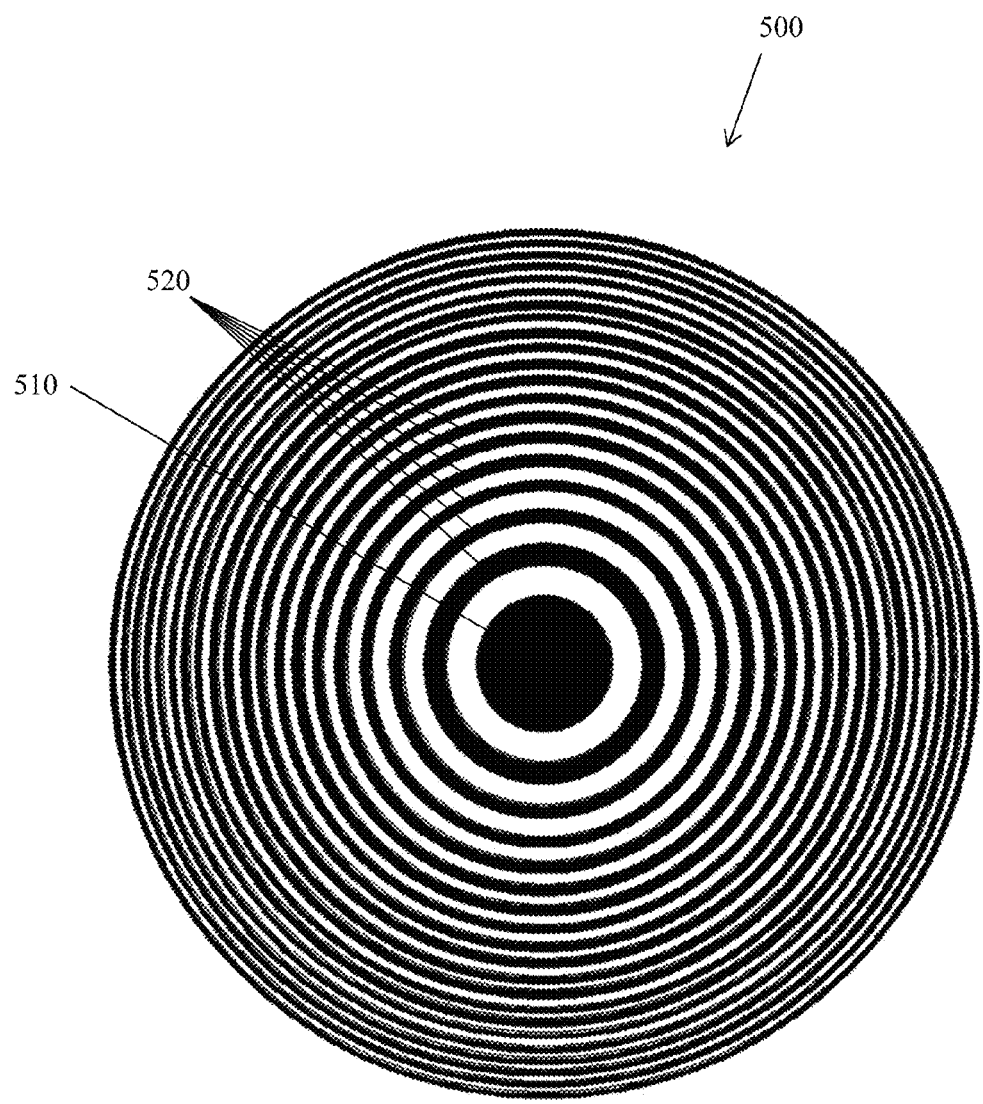
FIG. 5 shows a Fresnel zone pattern in accordance with one or more embodiments of the present invention.

FIG. 5 shows a Fresnel zone pattern 500 in accordance with one or more embodiments of the present invention. Fresnel zone pattern 500 is a substantially planar embossing pattern that may be disposed on flexo master (160 of FIG. 1) and printed on substrate (185 of FIG. 1) by one or more flexographic printing stations (100 of FIG. 1) of multi-station flexographic printing system (400 of FIG. 4). Fresnel zone pattern 500 may include a substantially circular ring 510 disposed in a center of pattern 500 and a plurality of concentric rings 520 disposed around the center of pattern 500. The focusing effect of Fresnel zone pattern 500 may be facilitated by ring 510 and rings 520 whose binary transitions occur at radii $r_n$ defined by the equation $r_n \cong \sqrt{n\lambda f}$, where n is an integer, $\lambda$ is the wavelength, and f is the focal length. Thus, Fresnel zone pattern 500 may include a binary pattern of circular ring 510 and concentric rings 520 interleaved with non-patterned areas disposed between the one or more circular ring 510 and concentric rings 520. When a Fresnel zone pattern 500 is printed, circular ring 510 and concentric rings 520 are inked and printed on substrate 185 forming circular ring 510 and concentric rings 520 on substrate 185. The non-patterned substrate 185 areas disposed between one or more of ring 510 and rings 520 are not printed and allow for transmission of light.

When the ring profile is binary, a Fresnel zone pattern 500 printed on substrate (185 of FIG. 1) generates constructive interference at fixed distances from Fresnel zone pattern 500. In one or more embodiments of the present invention, Fresnel zone pattern 500 generates constructive interference at odd fractions of the focal length, for example f, f/3, f/5, f/7, etc. In one or more embodiments of the present invention, Fresnel zone pattern 500 uses first order focus at focal length f. In other embodiments, Fresnel zone pattern 500 may use other odd fractions of the focal length. One of ordinary skill in the art will recognize that the configuration of Fresnel zone pattern 500 may be any configuration suitable for focusing light by diffraction in accordance with one or more embodiments of the present invention.

In one or more embodiments of the present invention, one or more flexo masters 160 of one or more flexographic printing stations 100 may include a Fresnel zone pattern 500. In certain embodiments, each flexo master 160 of each flexographic printing station 100 may include a Fresnel zone pattern 500 disposed in a unique position relative to other flexo masters 160 of the other stations 100. Each Fresnel zone pattern 500 may be disposed in a reserved space (not shown) of a flexo master 160. In one or more embodiments of the present invention, each Fresnel zone pattern 500 may fit within a square of approximately 8.33 square millimeters on flexo master 160. One of ordinary skill in the art will recognize that the configuration, location, and size of each Fresnel zone pattern 500 may vary in accordance with one or more embodiments of the present invention.

One of ordinary skill in the art will recognize that a Fresnel zone pattern 500 may be formed on a flexo master 160 by a conventional flexo master fabrication process. For example, Fresnel zone pattern 500 may be designed in a computer-aided drafting software application and exported to a standardized file format, such a Tagged Image File Format ("TIFF"). The TIFF file may be input to a thermal imaging system to produce a thermal imaging layer. The thermal imaging layer may be used to form a Fresnel zone pattern 500 on a flexo master substrate by a laser ablation process. Because the Fresnel zone patterns 500 are designed in a computer-aided drafting software application that generates the thermal imaging layer, a Fresnel zone pattern 500 may be precisely located on a flexo master 160. This allows for the fabrication of a plurality of flexo masters 160, each with a Fresnel zone pattern 500 positioned in a unique and precise position relative to one another.

Figure 6:
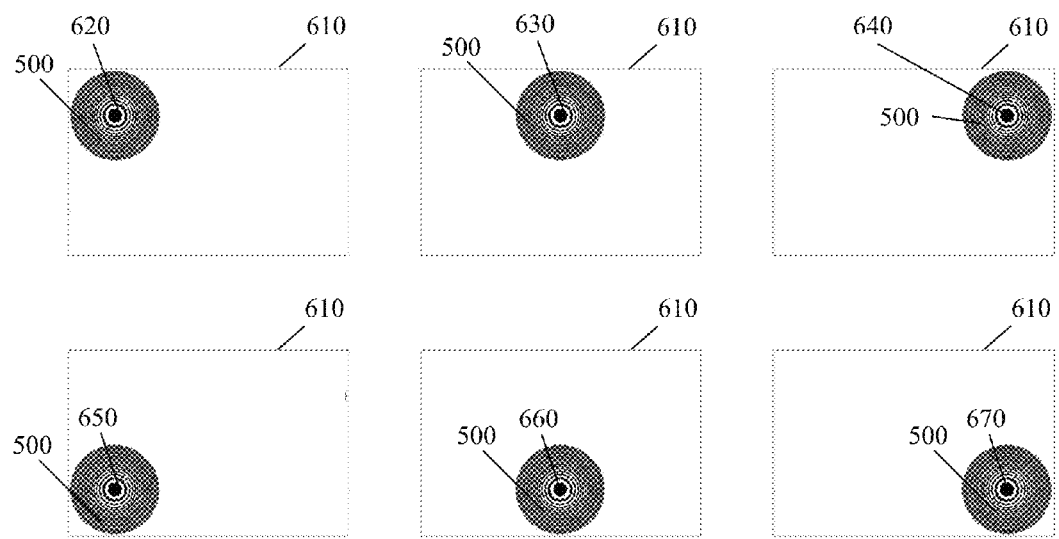
FIG. 6 shows a plurality of reserved spaces disposed on a plurality of flexo masters and a plurality of unique Fresnel zone pattern positions in accordance with one or more embodiments of the present invention.

FIG. 6 shows a plurality of reserved spaces 610 disposed on a plurality of flexo masters (160 of FIG. 1) and a plurality of unique Fresnel zone pattern 500 positions in accordance with one or more embodiments of the present invention. In one or more embodiments of the present invention, multi-station flexographic printing system 400 may include a plurality of flexographic printing stations 100. In one or more embodiments of the present invention, multi-station flexographic printing system 400 may include a flexographic printing station 100 configured for printing x-axis lines on a first side of substrate 185, a flexographic printing station 100 configured for printing y-axis lines on the first side of substrate 185, and a flexographic printing station 100 configured for printing interconnects and/or connectors on the first side of substrate 185. In one or more embodiments of the present invention, multi-station flexographic printing system 400 may include a flexographic printing station 100 configured for printing x-axis lines on a second side of substrate 185, a flexographic printing station 100 configured for printing y-axis lines on the second side of substrate 185, and a flexographic printing station 100 configured for printing interconnects or connectors on the second side of substrate 185. One of ordinary skill in the art will recognize that the number and sequence of flexographic printing stations 100 of multi-station flexographic printing system 400 may vary in accordance with one or more embodiments of the present invention.

In one or more embodiments of the present invention, a reserved space 610 may be disposed on a first flexo master 160 of a first flexographic printing station 100 in a non-patterned area of the flexo master 160. Reserved space 610 may be disposed in a non-patterned area that is close to a patterned area to ensure registration. Reserved space 610 may be a small area of approximately 50 square millimeters. One of ordinary skill in the art will recognize the location, shape, and size of reserved space 610 may vary in accordance with one or more embodiments of the present invention. A first Fresnel zone pattern 500 may be centered in a unique position 620 on reserved space 610 relative to a location of other Fresnel zone patterns (not shown) disposed on other flexo masters 160. One of ordinary skill in the art will recognize that the configuration, location, and size of Fresnel zone pattern 500 in position 620 may vary in accordance with one or more embodiments of the present invention.

In one or more embodiments of the present invention, a reserved space 610 may be disposed on a second flexo master 160 of second flexographic printing station 100 in a non-patterned area of the flexo master 160. Reserved space 610 may be disposed in a non-patterned area that is close to a patterned area to ensure registration. Reserved space 610 may be a small area of approximately 50 square millimeters. One of ordinary skill in the art will recognize the location, shape, and size of reserved space 610 may vary in accordance with one or more embodiments of the present invention. A second Fresnel zone pattern 500 may be centered in a unique position 630 on reserved space 610 relative to a location of other Fresnel zone patterns (not shown) disposed on other flexo masters. One of ordinary skill in the art will recognize that the configuration, location, and size of Fresnel zone pattern 500 in position 630 may vary in accordance with one or more embodiments of the present invention.

In one or more embodiments of the present invention, a reserved space 610 may be disposed on a third flexo master 160 of a third flexographic printing station 100 in a non-patterned area of the flexo master 160. Reserved space 610 may be disposed in a non-patterned area that is close to a patterned area to ensure registration. Reserved space 610 may be a small area of approximately 50 square millimeters. One of ordinary skill in the art will recognize the location, shape, and size of reserved space 610 may vary in accordance with one or more embodiments of the present invention. A third Fresnel zone pattern 500 may be centered in a unique position 640 on reserved space 610 relative to a location of other Fresnel zone patterns (not shown) disposed on other flexo masters. One of ordinary skill in the art will recognize that the configuration, location, and size of Fresnel zone pattern 500 in position 640 may vary in accordance with one or more embodiments of the present invention.

In one or more embodiments of the present invention, a reserved space 610 may be disposed on a fourth flexo master 160 of a fourth flexographic printing station 100 in a non-patterned area of the flexo master 160. Reserved space 610 may be disposed in a non-patterned area that is close to a patterned area to ensure registration. Reserved space 610 may be a small area of approximately 50 square millimeters. One of ordinary skill in the art will recognize the location, shape, and size of reserved space 610 may vary in accordance with one or more embodiments of the present invention. A fourth Fresnel zone pattern 500 may be centered in a unique position 650 on reserved space 610 relative to a location of other Fresnel zone patterns (not shown) disposed on other flexo masters. One of ordinary skill in the art will recognize that the configuration, location, and size of Fresnel zone pattern 500 in position 650 may vary in accordance with one or more embodiments of the present invention.

In one or more embodiments of the present invention, a reserved space 610 may be disposed on a fifth flexo master 160 of a fifth flexographic printing station 100 in a non-patterned area of the flexo master 160. Reserved space 610 may be disposed in a non-patterned area that is close to a patterned area to ensure registration. Reserved space 610 may be a small area of approximately 50 square millimeters. One of ordinary skill in the art will recognize the location, shape, and size of reserved space 610 may vary in accordance with one or more embodiments of the present invention. A fifth Fresnel zone pattern 500 may be centered in a unique position 660 on reserved space 610 relative to a location of other Fresnel zone patterns (not shown) disposed on other flexo masters. One of ordinary skill in the art will recognize that the configuration, location, and size of Fresnel zone pattern 500 in position 660 may vary in accordance with one or more embodiments of the present invention.

In one or more embodiments of the present invention, a reserved space 610 may be disposed on a sixth flexo master 160 of sixth flexographic printing station 100 in a non-patterned area of the flexo master 160. Reserved space 610 may be disposed in a non-patterned area that is close to a patterned area to ensure registration. Reserved space 610 may be a small area of approximately 50 square millimeters. One of ordinary skill in the art will recognize the location, shape, and size of reserved space 610 may vary in accordance with one or more embodiments of the present invention. A sixth Fresnel zone pattern 500 may be centered in a unique position 670 on reserved space 610 relative to a location of other Fresnel zone patterns (not shown) disposed on other flexo masters. One of ordinary skill in the art will recognize that the configuration, location, and size of Fresnel zone pattern 500 in position 670 may vary in accordance with one or more embodiments of the present invention.

Figure 7:
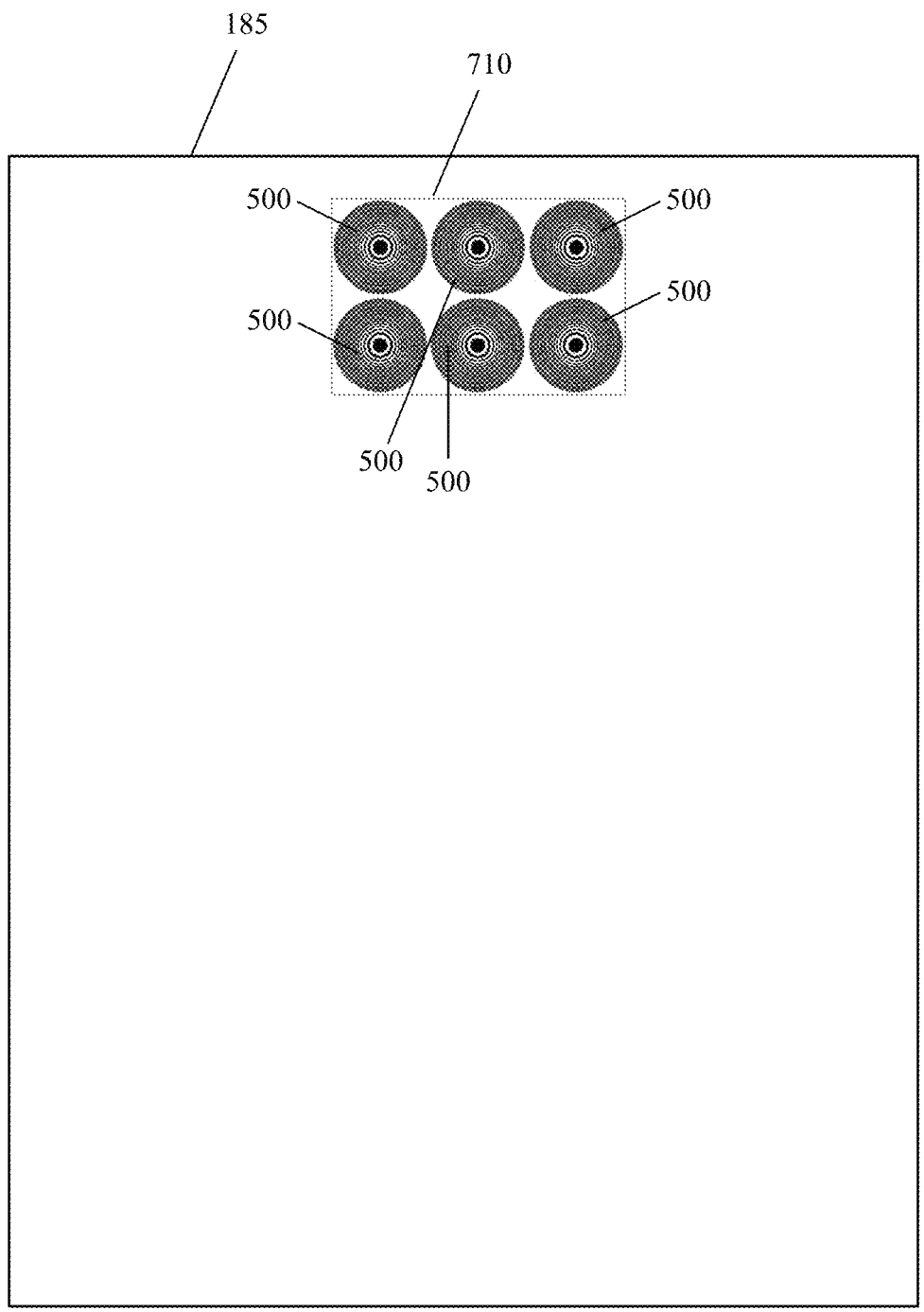
FIG. 7 shows a substrate printed with a Fresnel zone matrix in accordance with one or more embodiments of the present invention.

FIG. 7 shows a substrate 185 printed with a Fresnel zone matrix 710 in accordance with one or more embodiments of the present invention. In operation, multi-station flexographic printing system (400 of FIG. 4) includes a plurality of flexographic printing stations (100 of FIG. 1). One or more flexographic printing stations 100 includes a flexo master (160 of FIG. 1) that includes a Fresnel zone pattern 500 disposed in a unique position relative to other Fresnel zone patterns 500 disposed on other flexo masters 160. At each flexographic printing station 100, a Fresnel zone pattern 500 may be printed on a substrate 185 at a unique position. After substrate 185 has proceeded through all flexographic printing stations 100, substrate 185 includes a Fresnel zone matrix 710 composed of Fresnel zone patterns 500 printed on substrate 185. In one or more embodiments of the present invention, the number, location, configuration, and size of Fresnel zone patterns 500 printed on substrate 185 may vary based on the number of flexographic printing stations 100 in accordance with one or more embodiments of the present invention.

Figure 8:
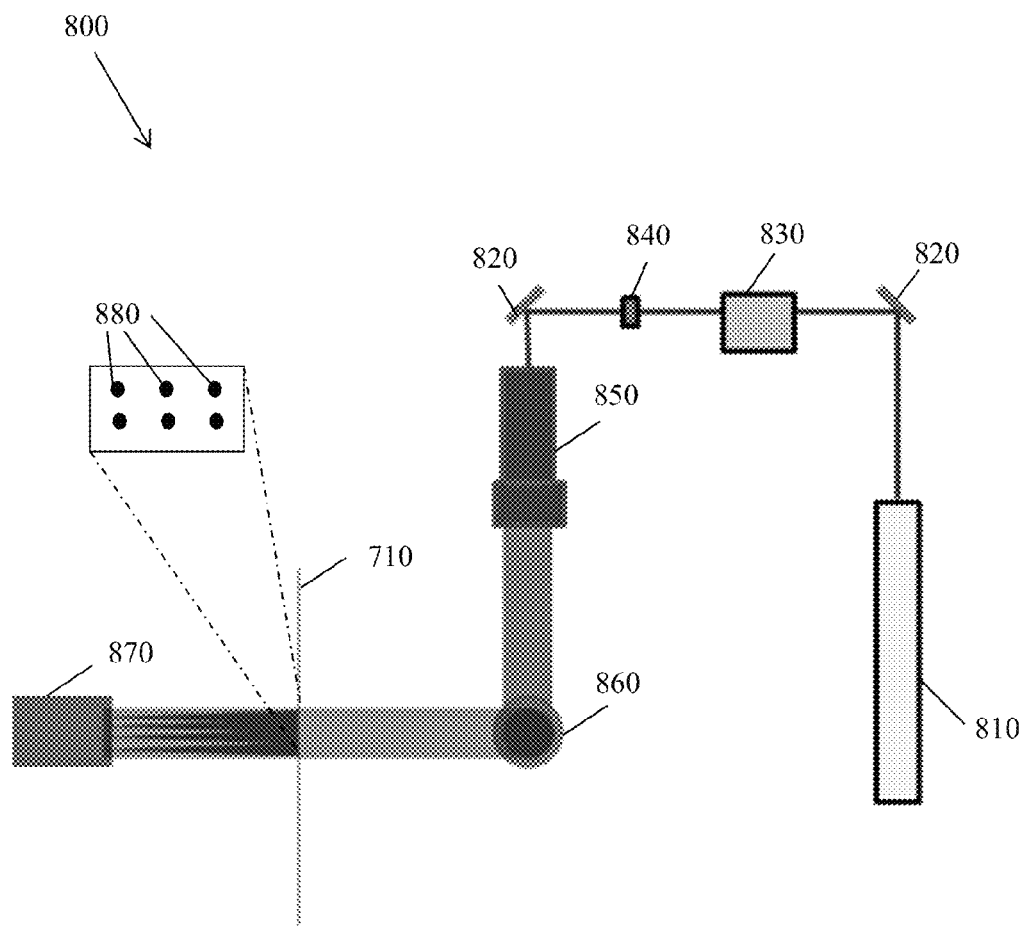
FIG. 8 shows a laser alignment system in accordance with one or more embodiments of the present invention.

FIG. 8 shows a laser alignment system 800 in accordance with one or more embodiments of the present invention. In one or more embodiments of the present invention, multi-station flexographic printing system 400 may include a laser alignment system 800 that measures alignment and may be configured to modify operational parameters of system 400 based on the measured alignment. Laser alignment system 800 may include a light source 810. In one or more embodiments of the present invention, light source 810 may be a helium-neon laser configured to produce light with a wavelength of approximately 633 nanometers. One of ordinary skill in the art will recognize that light source 810 and the wavelength of light produced by light source 810 may vary in accordance with one or more embodiments of the present invention.

Light from light source 810 may be directed to an electro-optic modulator 830 by a turning mirror 820. Electro-optic modulator 830 may be used to rotate the polarization of the light by 90 degrees. The light exiting electro-optic modulator 830 may be directed to a polarizer 840. Polarizer 840 may be oriented perpendicular to a polarization state of the un-modulated light source 810 to prevent extraneous light from reaching a sensor device 870. In one or more embodiments of the present invention, polarizer 840 may be a Glan-Thompson polarizer. One of ordinary skill in the art will recognize that polarizer 840 may be any polarizer suitable for polarizing light exiting electro-optic modulator 830 to prevent extraneous light from reaching sensor device 870. The light exiting polarizer 840 may be directed to a beam expander 850 by a turning mirror 820. Beam expander 850 may be used to enlarge the beam of light exiting polarizer 840. The light exiting beam expander 850 may be reflected by periscope reflector 860. In one or more embodiments of the present invention, periscope reflector 860 provides two degrees of freedom such that the light may be precisely positioned. The light reflected by periscope reflector 860 may be directed through a Fresnel zone matrix 710 printed on substrate 185.

Each Fresnel zone pattern 500 of the Fresnel zone matrix 710 may be printed in unique position on substrate 185 by its respective flexographic printing station 100. Each Fresnel zone pattern 500 of Fresnel zone matrix 710 printed on substrate 185 may function as a Fresnel lens that focuses light. When light is incident on the Fresnel zone matrix 710 on transparent substrate 185, each Fresnel zone pattern 500 focuses the light in a concentrated beam 880 corresponding to a center of the Fresnel zone pattern 500 that is captured by a sensor device 870. In one or more embodiments of the present invention, sensor device 870 may be a charge-coupled device or camera sensor device. In one or more embodiments of the present invention, a precision of laser alignment system 800 may be limited by a pixel size of sensor device 870. In one or more embodiments of the present invention, concentrated beams 880 of light may be 300 times brighter than ambient background light.

In one or more embodiments of the present invention, light source 810 may function as a strobe illuminator. A strobe illuminator produces timed flashes of light that effectively freeze movement. In one or more embodiments of the present invention, light source 810 may produce a flash of light at a time when a substrate 185 with a Fresnel zone matrix 710 is in position for alignment measurement as part of the roll-to-roll operation of multi-station flexographic printing system 400. In this way, a plurality of substrates 185 may proceed through system 400 unfettered and laser alignment system 800 may capture the concentrated beams 880 of each Fresnel zone pattern 500 of the Fresnel zone matrix 710 for each substrate 185. In one or more embodiments of the present invention, light source 810 may produce timed flashes of light in a range between approximately 5 microseconds and approximately 10 microseconds to effectively freeze the position of Fresnel zone matrix 710 for sensor device 870.

In one or more embodiments of the present invention, laser alignment system 800 may be coupled to a computer (not shown) that calculates the relative position of concentrated beams 880. In one or more embodiments of the present invention, laser alignment system 800 may be coupled to a computer (not shown) that quantifies the alignment of concentrated beams 880 relative to an expected alignment. In one or more embodiments of the present invention, deviations of alignment of concentrated beams 880 relative to an expected alignment may be determined in an x-axis direction and y-axis direction. In one or more embodiments of the present invention, deviations of alignment of concentrated beams 880 relative to an expected alignment may be determined in a machine direction and a transverse direction. One or ordinary skill in the art will recognize that a computer (not shown) may determine deviations of alignment in any direction for each Fresnel zone pattern 500 of Fresnel zone matrix 710.

FIG. 9A shows an example of a substrate 185 printed with a Fresnel zone matrix 710 that includes one or more misaligned Fresnel zone patterns 500 in accordance with one or more embodiments of the present invention. In the Figure, substrate 185 may be printed with a Fresnel zone matrix 710 that includes misaligned Fresnel zone pattern 910 and misaligned Fresnel zone pattern 920. One of ordinary skill in the art will recognize that the number of misaligned Fresnel zone patterns 500 may vary. Fresnel zone pattern 910 may be printed by a first flexographic printing station (100 of FIG. 1). A misalignment of Fresnel pattern 910 may indicate that an adjustment needs to be made at the first flexographic printing station 100. The misalignment of Fresnel pattern 910 may indicate that an adjustment needs to be made between the first flexographic printing station 100 and another flexographic printing station (100 of FIG. 1) disposed before or after the first flexographic printing station 100 in the printing sequence. Fresnel zone pattern 920 may be printed by a sixth flexographic printing station (100 of FIG. 1). A misalignment of Fresnel pattern 920 may indicate that an adjustment needs to be made at the sixth flexographic printing station 100. The misalignment of Fresnel pattern 920 may indicate that an adjustment needs to be made between the sixth flexographic printing station 100 and another flexographic printing station (100 of FIG. 1) disposed before or after the sixth flexographic printing station 100 in the printing sequence.

As part of the roll-to-roll operation of multi-station flexographic printing system 400, substrate 185 may be processed by a laser alignment system 800. When light is directed by laser alignment system 800 through misaligned Fresnel zone matrix 710 of substrate 185, a sensor device (870 of FIG. 8) captures concentrated beams 880 corresponding to the focused light of Fresnel zone patterns 500 of misaligned Fresnel zone matrix 710. In FIG. 9B, concentrated beams 880 of each Fresnel zone pattern 500 may be captured including misaligned concentrated beam 930 corresponding to misaligned Fresnel zone pattern 910 and misaligned concentrated beam 940 corresponding to misaligned Fresnel zone pattern 920. A computer (not shown) may quantify an alignment of misaligned concentrated beams 930 and 940 relative to an expected alignment. Once a misalignment is quantified, the computer (not shown) may adjust one or more operational parameters of one or more flexographic printing stations 100 of multi-station flexographic printing system 400 to correct the misalignment. For example, a printing offset may be added to one or more flexographic printing stations 100 to compensate for a misalignment or a timing between one or more flexographic printing stations may be adjusted.

In one or more embodiments of the present invention, the computer (not shown) may control a delay between a printing press timing signal and a triggering signal for electro-optic modulator 830 and sensor device 870 frame capture. In one or more embodiments of the present invention, the computer (not shown) may acquire image date from sensor device 870. In one or more embodiments of the present invention, the computer (not shown) may calculate a relative position of each concentrated beam 880. In one or more embodiments of the present invention, the computer (not shown) may display an image corresponding to the concentrated beams 880 and misalignment data. In one or more embodiments of the present invention, an operator may use the computer (not shown) to adjust operational parameters of one or more flexographic printing stations 100 to correct the misalignment. In one or more embodiments of the present invention, the computer (not shown) may automatically adjust operational parameters of one or more flexographic printing stations 100 to correct the misalignment. In one or more embodiments of the present invention, the computer (not shown) may automatically adjust operational parameters of multi-station flexographic printing system 400.

In one or more embodiments of the present invention, laser alignment system 800 may determine a misalignment with a precision that is limited by a pixel size of sensor device 870. In one or more embodiments of the present invention, laser alignment system 800 may provide for alignment accuracy of approximately 5 micrometers or less in a machine and transverse direction. In one or more embodiments of the present invention, laser alignment system 800 may provide alignment accuracy in a range between approximately 5 micrometers and 15 micrometers in a machine and transverse direction.

Figure 10:
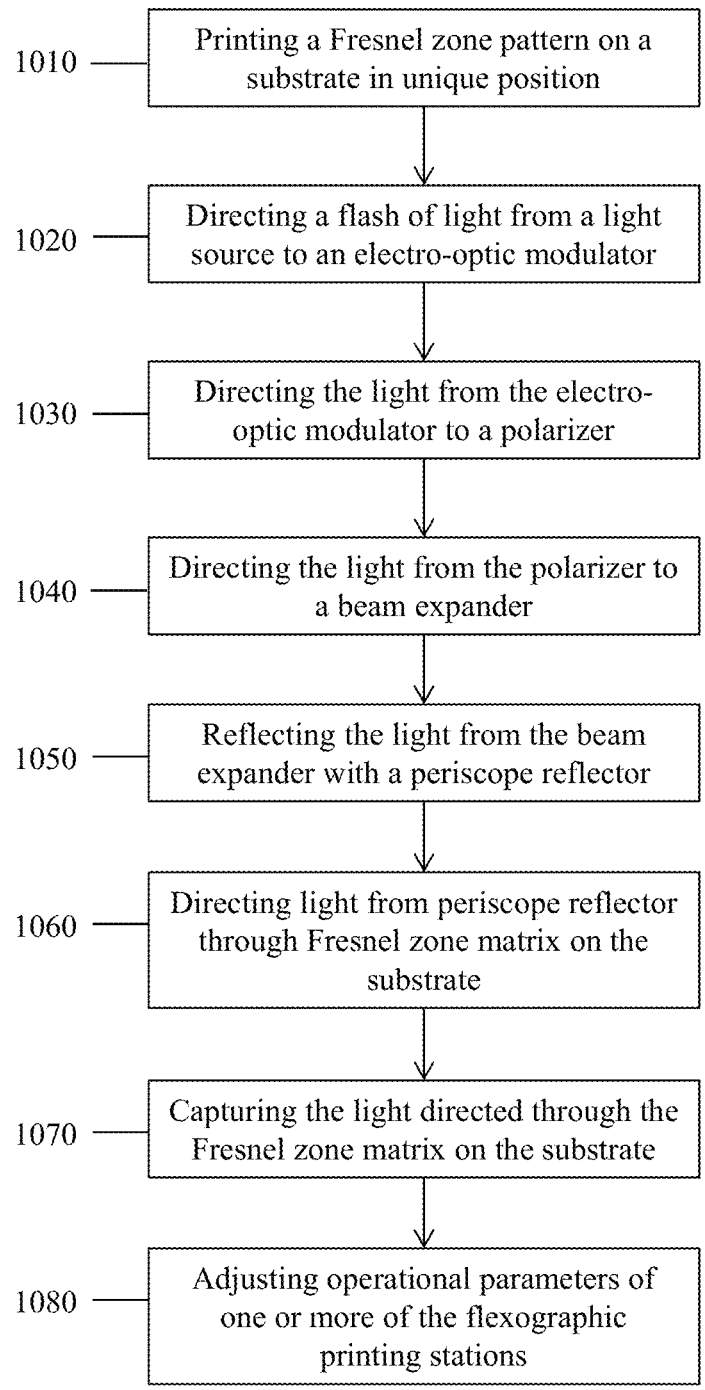
FIG. 10 shows a method of aligning flexographic printing stations of a multi-station flexographic printing system in accordance with one or more embodiments of the present invention.

FIG. 10 shows a method of aligning a plurality of flexographic printing stations of a multi-station flexographic printing system in accordance with one or more embodiments of the present invention. In one or more embodiments of the present invention, a multi-station flexographic printing system may include a laser alignment system that measures alignment and may be configured to modify operational parameters of the system based on the measured alignment. In step 1010, one or more flexographic printing stations of a multi-station flexographic printing system prints a Fresnel zone pattern on a substrate in a unique position forming a Fresnel zone matrix on the substrate. In step 1020, a light source directs light through an electro-optic modulator. The light source may function as a strobe illuminator. In one or more embodiments of the present invention, the light source may produce a timed flash of light in a range between approximately 5 microseconds and 10 microseconds to effectively freeze the position of concentrated beams of light for a sensor device while the substrate proceeds through the multi-station flexographic printing system. The electro-optic modulator may rotate the polarization of the light by 90 degrees.

In step 1030, the light is directed from the electro-optic modulator to a polarizer. The polarizer may be oriented perpendicular to a polarization state of the light source to prevent any extraneous light from reaching the sensor device. In one or more embodiments of the present invention, the polarizer is a Glan-Thompson polarizer. In step 1040, the light is directed from the polarizer to a beam expander. The beam expander may be used to enlarge the beam of light exiting the polarizer. In step 1050, the light from the beam expander is reflected by a periscope reflector. The periscope reflector provides two degrees of freedom so that the light may be precisely positioned. In certain embodiments, multiple turning mirrors may be used instead of the periscope reflector. In step 1060, the light is directed from the periscope reflector through the substrate that includes the Fresnel zone matrix. The Fresnel zone matrix includes the plurality of Fresnel zone patterns. When the light is incident on the Fresnel zone matrix on the substrate, each Fresnel zone pattern focuses the light in a concentrated beam corresponding to a center of the Fresnel zone pattern. In step 1070, the light focused through the Fresnel zone patterns of the Fresnel zone matrix are captured by the sensor device. In one or more embodiments of the present invention, the sensor device may be a charge-coupled device or camera sensor device. In step 1080, an operator and/or computer may adjust operational parameters of one or more flexographic printing stations to correct the misalignment. In one or more embodiments of the present invention, the computer may calculate the relative position of concentrated beams. In one or more embodiments of the present invention, the computer may quantify the alignment of concentrated beams relative to an expected alignment. In one or more embodiments of the present invention, deviations of alignment of concentrated beams relative to an expected alignment may be determined in an x-axis direction and y-axis direction. In one or more embodiments of the present invention, deviations of alignment of concentrated beams relative to an expected alignment may be determined in a machine direction and a transverse direction.

In one or more embodiments of the present invention, the computer may control a delay between a printing press timing signal and a triggering signal of an electro-optic modulator and sensor frame capture. In one or more embodiments of the present invention, the computer may acquire image date from the sensor. In one or more embodiments of the present invention, the computer may calculate a relative position of each concentrated beam. In one or more embodiments of the present invention, the computer may display an image corresponding to the concentrated beams and misalignment data. In one or more embodiments of the present invention, the computer may automatically adjust operational parameters of one or more flexographic printing stations to correct the misalignment. In one or more embodiments of the present invention, the computer may automatically adjust operational parameters of multi-station flexographic printing system.

Advantages of one or more embodiments of the present invention may include one or more of the following:

In one or more embodiments of the present invention, a laser-aligned multi-station flexographic printing system may be used in production as part of quality assurance testing. As substrates are printed, the laser-alignment system may assess the quality of printed substrates based on the measured alignment.

In one or more embodiments of the present invention, a laser-aligned multi-station flexographic printing system improves alignment accuracy.

In one or more embodiments of the present invention, a laser-aligned multi-station flexographic printing system improves alignment accuracy to approximately 5 micrometers or less.

In one or more embodiments of the present invention, a laser-aligned multi-station flexographic printing system improves alignment accuracy in a range between approximately 5 micrometers and approximately 10 micrometers.

In one or more embodiments of the present invention, a laser-aligned multi-station flexographic printing system improves alignment accuracy in a machine direction.

In one or more embodiments of the present invention, a laser-aligned multi-station flexographic printing system improves alignment accuracy in a transverse direction.

In one or more embodiments of the present invention, a laser-aligned multi-station flexographic printing system improves alignment accuracy in any direction.

In one or more embodiments of the present invention, a laser-aligned multi-station flexographic printing system may identify misalignments of one or more flexographic printing stations.

In one or more embodiments of the present invention, a laser-aligned multi-station flexographic printing system may correct misalignments of one or more flexographic printing stations.

In one or more embodiments of the present invention, a laser-aligned multi-station flexographic printing system may correct misalignments by adjusting operational parameters of one or more of the flexographic printing stations while printing is in process.

In one or more embodiments of the present invention, a laser-aligned multi-station flexographic printing system may identify and correct misalignments in an automated process.

In one or more embodiments of the present invention, a laser-aligned multi-station flexographic printing system is inexpensive to implement.

In one or more embodiments of the present invention, a laser-aligned multi-station flexographic printing system is compatible with existing flexographic printing processes.

In one or more embodiments of the present invention, a laser-aligned multi-station flexographic printing system does not slow down the flexographic printing process.

While the present invention has been described with respect to the above-noted embodiments, those skilled in the art, having the benefit of this disclosure, will recognize that other embodiments may be devised that are within the scope of the invention as disclosed herein. Accordingly, the scope of the invention should be limited only by the appended claims.

What is claimed is:

1. A method of aligning a plurality of flexographic printing stations comprising:
   printing a Fresnel zone pattern on a substrate in a unique position for each flexographic printing station;
   directing light through the Fresnel zone patterns on the substrate;
   capturing the light focused by the Fresnel zone patterns with a sensor device;
   using the light captured by the sensor device to identify a misalignment of one or more flexographic printing stations of the plurality of flexographic printing stations; and correcting the misalignment of the one or more flexographic printing stations by adjusting operational parameters of the one or more flexographic printing stations.

2. The method of claim 1, further comprising:
directing a flash of light from a light source to an electro-optic modulator.

3. The method of claim 2, further comprising:
directing the light from the electro-optic modulator to a polarizer.

4. The method of claim 3, further comprising:
directing the light from the polarizer to a beam expander.

5. The method of claim 4, further comprising:
reflecting the light from the beam expander with a periscope reflector.

6. The method of claim 5, further comprising:
directing light from the periscope reflector through the Fresnel zone patterns on the substrate.

* * * * *